United States Patent
Owens

(10) Patent No.: US 7,629,307 B2
(45) Date of Patent: Dec. 8, 2009

(54) TERNARY AZEOTROPIC-LIKE COMPOSITIONS WITH 1,1,1,2,3,3-HEXAFLUORO-3-METHOXY-PROPANE AND TRANS-1,2-DICHLOROETHYLENE

(75) Inventor: John G. Owens, Woodbury, MN (US)

(73) Assignee: 3M Innovative Properties Company, St. Paul, MN (US)

(*) Notice: Subject to any disclaimer, the term of this patent is extended or adjusted under 35 U.S.C. 154(b) by 205 days.

(21) Appl. No.: 12/015,826

(22) Filed: Jan. 17, 2008

(65) Prior Publication Data

US 2009/0186799 A1 Jul. 23, 2009

(51) Int. Cl.
*C11D 7/50* (2006.01)

(52) U.S. Cl. .................. 510/410; 510/411; 510/412; 134/40; 252/364

(58) Field of Classification Search .................. 510/410, 510/411, 412; 252/364; 134/40
See application file for complete search history.

(56) References Cited

U.S. PATENT DOCUMENTS

| | | | | |
|---|---|---|---|---|
| 4,904,407 A * | 2/1990 | Swan et al. | ................... | 510/178 |
| 5,023,009 A | 6/1991 | Merchant | | |
| 5,023,010 A * | 6/1991 | Merchant | ...................... | 252/69 |
| 5,026,498 A * | 6/1991 | Merchant | ...................... | 510/177 |
| 5,037,572 A * | 8/1991 | Merchant | ...................... | 252/67 |
| 5,064,558 A * | 11/1991 | Swan et al. | ................... | 510/409 |
| 5,098,595 A * | 3/1992 | Merchant | ...................... | 252/67 |
| 6,030,934 A * | 2/2000 | Owens et al. | ................ | 510/411 |
| 6,048,832 A | 4/2000 | Thenappan et al. | | |
| 6,281,185 B1 * | 8/2001 | Owens et al. | ................ | 510/411 |
| 6,326,338 B1 | 12/2001 | Garrett | | |
| 6,951,835 B1 * | 10/2005 | Minor et al. | ................. | 510/410 |
| 7,531,496 B2 * | 5/2009 | Minor et al. | ................. | 510/411 |
| 2004/0171510 A1 * | 9/2004 | Minor et al. | ................. | 510/410 |
| 2004/0259752 A1 | 12/2004 | DeGroot et al. | | |
| 2005/0267006 A1 * | 12/2005 | Minor et al. | ................. | 510/411 |
| 2009/0186799 A1 * | 7/2009 | Owens | ........................ | 510/411 |

FOREIGN PATENT DOCUMENTS

| | | |
|---|---|---|
| JP | 11-92411 | 4/1999 |
| JP | 11-92412 | 4/1999 |
| WO | WO 97/28229 | 8/1997 |
| WO | WO 98/37163 | 8/1998 |

OTHER PUBLICATIONS

PCT International Search Report, PCT/US2009/030288, Apr. 8, 2009.
Tsai, Wen-Tien, "Environmental risk assessment of hydrofluoroethers (HFEs)," Journal of Hazardous Materials, Elsevier, vol. 119, No. 1-3, pp. 69-78, Jan. 26, 2005.
ASTM D 3278-96 e1, "Standard Test Methods for Flash Point of Liquids by Small Scale Closed-Cup Apparatus", (2004), ASTM Int'l.

* cited by examiner

*Primary Examiner*—Gregory E Webb
(74) *Attorney, Agent, or Firm*—Kent S. Kokko

(57) ABSTRACT

Ternary azeotrope and azeotrope-like compositions containing 1,1,1,2,3,3-hexafluoro-3-methoxy-propane, trans-1,2-dichloroethylene and a third component, and methods of using azeotropes and azeotrope-like compositions to clean substrates, deposit coatings, transfer thermal energy, and lubricate working operations are described.

16 Claims, 1 Drawing Sheet

TERNARY AZEOTROPIC-LIKE COMPOSITIONS WITH 1,1,1,2,3,3-HEXAFLUORO-3-METHOXY-PROPANE AND TRANS-1,2-DICHLOROETHYLENE

TECHNICAL FIELD

This invention relates to ternary azeotrope and azeotrope-like compositions containing 1,1,1,2,3,3-hexafluoro-3-methoxy-propane, trans-1,2-dichloroethylene and a third component, and methods of using azeotropes and azeotrope-like compositions to clean substrates, deposit coatings, transfer thermal energy, and lubricate working operations.

BACKGROUND

Chlorofluorocarbons (CFCs), hydrochlorofluorocarbons (HCFCs), and hydrochlorocarbons (HCCs, e.g., 1,1,1-trichloroethane and carbon tetrachloride) have been used in a wide variety of solvent applications such as drying, cleaning (e.g., the removal of flux residues from printed circuit boards), and vapor degreasing. These materials have also been used in refrigeration and heat-transfer processes. However, the photolytic and homolytic reactivity at the chlorine-containing carbon sites has been shown to contribute to depletion of the earth's ozone layer. Additionally, the long atmospheric lifetime of CFCs has been linked to global warming. As a result, there has been a world-wide movement to replace CFCs.

The characteristics sought in replacements, in addition to low ozone depletion potential, typically have included boiling point ranges suitable for a variety of solvent cleaning applications, low flammability, and low toxicity. For some applications, solvent replacements should also have the ability to dissolve both hydrocarbon-based and fluorocarbon-based soils. In some embodiments, solvent replacements also have low toxicity, have no flash points (as measured by ASTM D3278-98 e-1, "Flash Point of Liquids by Small Scale Closed-Cup Apparatus"), have acceptable stability, have short atmospheric lifetimes, and have low global warming potentials.

Hydrofluoroethers (HFEs) have gained interest as replacements for CFCs and HCFCs. Generally, HFEs are chemically stable, have low toxicity, are non-flammable, and are non-ozone depleting.

In some instances, HFEs can form azeotropes with one or more co-solvents to modify or enhance the solvent characteristics of the HFE. Many azeotropes possess properties that make them useful solvents. For example, azeotropes have a constant boiling point that avoids boiling temperature drift during processing and use. In addition, when an azeotrope is used as a solvent, the properties remain constant because the composition does not change during boiling or reflux. Azeotropes that are used as solvents also can be recovered conveniently by distillation.

SUMMARY

In some embodiments, it is desirable to provide azeotrope-like compositions that have good solvent strength. In another aspect, in some embodiments, it is desirable to provide azeotrope-like compositions that have low flammability. In yet another aspect, in some embodiments, it is desirable to provide azeotrope-like compositions that are non-ozone depleting, and/or have a relatively short atmospheric lifetime so that they do not significantly contribute to global warming (i.e., azeotrope-like compositions that have low global warming potential).

Briefly, in one embodiment, the present invention provides ternary azeotrope-like compositions comprising a blend of 1,1,1,2,3,3-hexafluoro-3-methoxy-propane, trans-1,2-dichloroethylene and a third component. The third component is selected from methanol, ethanol, isopropanol, trifluoroethanol and pentafluoropropanol. In some embodiments, the azeotrope-like compositions further comprise a lubricious additive, and/or hydrofluoric acid.

In another embodiment, the present invention provides a coating composition comprising an azeotrope-like composition and at least one coating material soluble or dispersible in the azeotrope-like composition.

In yet another embodiment, the present invention provides a process for depositing a coating on a surface comprising applying a coating composition comprising an azeotrope-like composition to at least a portion of a surface, wherein the at least one coating material is soluble or dispersible in the azeotrope-like composition.

In yet another embodiment, the present invention provides a process for lubricating metal, cermet, or composite wherein said process uses a lubricating fluid comprising an azeotrope-like composition of the present invention.

In yet another embodiment, the present invention provides a process for assisting in the removal of contaminants from the surface of a substrate comprising the steps of contacting the substrate with one or more of the azeotrope-like compositions according to the present invention until the contaminants are dissolved, dispersed, or displaced in or by the azeotrope-like composition, and removing the azeotrope-like composition containing the dissolved, dispersed or displaced contaminants from the surface of the substrate.

In yet another embodiment, the present invention provides a process for heat transfer wherein one or more of the azeotrope-like compositions according to the present invention is used as a heat-transfer fluid.

The above summary is not intended to describe each embodiment. The details of one or more embodiments of this disclosure are also set forth in the description below. Other features, objects, and advantages will be apparent from the description and from the claims.

BRIEF DESCRIPTION OF DRAWINGS

Embodiments of the present disclosure are illustrated by way of example, and not limitation, in the accompanying drawings in which.

DETAILED DESCRIPTION

Figure 1:
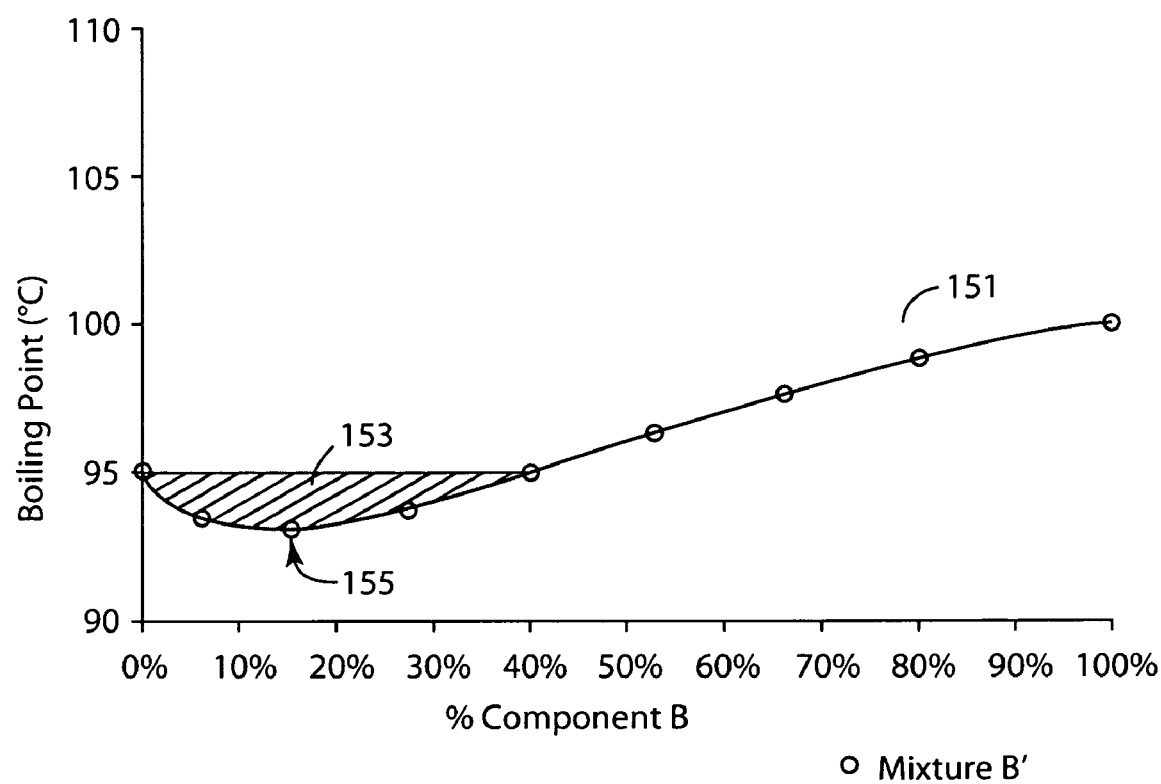
FIG. 1 is a schematic diagram of boiling point versus percent component B, illustrating an azeotrope and azeotrope-like region.

An azeotropic composition, or azeotrope, comprises a mixture of two or more substances that behaves like a single substance in which the vapor produced by partial evaporation of the liquid azeotropic composition at its boiling point has the same composition as the liquid.

Azeotropic compositions are constant boiling point mixtures that exhibit either a maximum boiling point that is higher than, or a minimum boiling point that is lower than, each of the individual components To define terminology, FIG. 1 will be used. Shown in FIG. 1 is a hypothetical mixture B'. Mixture B' comprises components A and B. Mixture B' is plotted as boiling point versus percent component B and is represented as curve 151. In FIG. 1, the boiling points of the individual components, A and B, are 95° C., and 100° C., respectively. The azeotrope of mixture B' is represented by 155. This azeotrope has a boiling point that is lower than both component A and B.

Azeotrope-like compositions boil at temperatures that are either above each of the individual components or below the boiling point of the each of the individual components. The azeotrope-like region of mixture B' is represented by shaded area 153. The B' compositions comprising between greater than 0% and 40% of component B are considered azeotrope-like and have boiling points that are lower than both component A and B. As can be seen in FIG. 1, the azeotrope composition is included in the range of azeotrope-like compositions for a particular mixture of substances. A ternary azeotrope and azeotrope-like composition may similarly be plotted to produce a three-dimensional volume, like the area 153.

The azeotrope-like compositions comprise 1,1,1,2,3,3-hexafluoro-3-methoxy-propane, trans-1,2-dichloroethylene, and a third component, which is selected from methanol, ethanol, isopropanol, trifluoroethanol and pentafluoropropanol. The concentration of the three components may vary substantially from the corresponding azeotropic composition, and the magnitude of this permissible variation depends upon the specific third component. In some embodiments, the azeotropic-like composition comprises essentially the same concentrations of the 1,1,1,2,3,3-hexafluoro-3-methoxy-propane, trans-1,2-dichloroethylene, and a third component, as comprise the azeotrope formed between them at ambient pressure. In some embodiments, the azeotrope-like compositions exhibit no significant change in the solvent power of the composition over time.

Typically, azeotrope-like compositions retain some of the properties of the individual component solvents, which can enhance performance over the individual components because of the combined properties.

In addition to the 1,1,1,2,3,3-hexafluoro-3-methoxy-propane, trans-1,2-dichloroethylene, and a third component, other compounds that do not interfere in the formation of the azeotrope-like composition may be added. Typically, the other compounds will be present in small amounts. For example, in some embodiments, co-solvents or surfactants may be present to, for example, improve the dispersibility or the solubility of materials, such as water, soils, or coating materials (e.g., perfluoropolyether lubricants and fluoropolymers), in an azeotrope-like composition. In some embodiments, small amounts of lubricious additives may be present to, for example, enhance the lubricating properties of an azeotrope-like composition.

In some embodiments, the azeotrope-like compositions comprise a blend of 1,1,1,2,3,3-hexafluoro-3-methoxy-propane, trans-1,2-dichloroethylene, and a third component, wherein the composition is selected from:

(i) a blend consisting essentially of 1,1,1,2,3,3-hexafluoro-3-methoxy-propane, trans-1,2-dichloroethylene and methanol, when fractionally distilled, forms a distillate fraction that is an azeotrope consisting essentially of about 52.9 weight percent of 1,1,1,2,3,3-hexafluoro-3-methoxy-propane, 41.6 weight percent of trans-1,2-dichloroethylene and 5.5 weight percent of methanol that boils about 37.9° C. at 734 torr; or (ii) a blend consisting essentially of 1,1,1,2,3,3-hexafluoro-3-methoxy-propane, trans-1,2-dichloroethylene and ethanol, when fractionally distilled, forms a distillate fraction that is an azeotrope consisting essentially of about 50.9 weight percent of 1,1,1,2,3,3-hexafluoro-3-methoxy-propane, 46.5 weight percent of trans-1,2-dichloroethylene and 2.6 weight percent of ethanol that boils about 40.7° C. at 733 torr; or (iii) a blend consisting essentially of 1,1,1,2,3,3-hexafluoro-3-methoxy-propane, trans-1,2-dichloroethylene and isopropanol when fractionally distilled, forms a distillate fraction that is an azeotrope consisting essentially of about 50.5 weight percent of 1,1,1,2,3,3-hexafluoro-3-methoxy-propane, 48.2 weight percent of trans-1,2-dichloroethylene and 1.3 weight percent of isopropanol that boils about 41.5° C. at 731 torr; or (iv) a blend consisting essentially of 1,1,1,2,3,3-hexafluoro-3-methoxy-propane, trans-1,2-dichloroethylene and trifluoroethanol when fractionally distilled, forms a distillate fraction that is an azeotrope consisting essentially of about 44.6 weight percent of 1,1,1,2,3,3-hexafluoro-3-methoxy-propane, 44.7 weight percent of trans-1,2-dichloroethylene and 10.7 weight percent of trifluoroethanol that boils about 40.6° C. at 735 torr; or (v) a blend consisting essentially of 1,1,1,2,3,3-hexafluoro-3-methoxy-propane, trans-1,2-dichloroethylene and pentafluoropropanol when fractionally distilled, forms a distillate fraction that is an azeotrope consisting essentially of 44.2 weight percent of 1,1,1,2,3,3-hexafluoro-3-methoxy-propane, 53.1 weight percent of trans-1,2-dichloroethylene and 2.7 weight percent of pentafluoropropanol that boils about 42.1° C. at 734 torr.

In some embodiments the concentrations of 1,1,1,2,3,3-hexafluoro-3-methoxy-propane, trans-1,2-dichloroethylene, and the third component in the azeotrope-like composition differ from the concentrations of such components in the corresponding azeotrope by no more than about ten percent. In another embodiment, the concentrations of 1,1,1,2,3,3-hexafluoro-3-methoxy-propane, trans-1,2-dichloroethylene, and the third component in the azeotrope-like composition differ from the concentrations of such components in the corresponding azeotrope by no more than about five percent.

In other words, the azeotrope-like composition may consist essentially of a blend of 1,1,1,2,3,3-hexafluoro-3-methoxy-propane, trans-1,2-dichloroethylene, and the third component wherein the concentrations differs from that of the azeotrope by +/−10 percent:

(i) a blend consisting essentially of 47.6 to about 58.2 weight percent of 1,1,1,2,3,3-hexafluoro-3-methoxy-propane, 37.4 to about 45.8 weight percent of trans-1,2-dichloroethylene and 5.0 to 6.0 weight percent of methanol, when fractionally distilled, forms a distillate fraction that is an azeotrope that boils about 37.9° C. at 734 torr;

(ii) a blend consisting essentially of 45.8 to about 56.0 weight percent of 1,1,1,2,3,3-hexafluoro-3-methoxy-propane, 41.9 to about 51.2 weight percent of trans-1,2-dichloroethylene and 2.3 to 2.9 weight percent of ethanol, when fractionally distilled, forms a distillate fraction that is an azeotrope that boils about 40.7° C. at 733 torr; or (iii) a blend consisting essentially of 45.5 to about 55.6 weight percent of 1,1,1,2,3,3-hexafluoro-3-methoxy-propane, 43.4 to about 53.0 weight percent of trans-1,2-dichloroethylene and 1.2 to 1.4 weight percent of isopropanol, when fractionally distilled, forms a distillate fraction that is an azeotrope that boils about 41.5° C. at 731 torr; or (iv) a blend consisting essentially of 40.1 to about 49.1 weight percent of 1,1,1,2,3,3-hexafluoro-3-methoxy-propane, 40.2 to about 49.2 weight percent of trans-1,2-dichloroethylene and 9.6 to 11.8 weight percent of trifluoroethanol, when fractionally distilled, forms a distillate fraction that is an azeotrope that boils about 40.6° C. at 735 torr; or (v) a blend consisting essentially of 39.8 to about 48.6 weight percent of 1,1,1,2,3,3-hexafluoro-3-methoxy-propane, 47.8 to about 58.4 weight percent of trans-1,2-dichloroethylene and 2.4 to 3.0 weight percent of pentafluoropropanol, when fractionally distilled, forms a distillate fraction that is an azeotrope that boils about 42.1° C. at 734 torr.

In other embodiments, the azeotrope-like composition may consist essentially of a blend of 1,1,1,2,3,3-hexafluoro-3-methoxy-propane, trans-1,2-dichloroethylene, and the third component wherein the concentrations differs from that of the azeotrope by +/−5 percent:

(i) a blend consisting essentially of 50.3 to about 55.5 weight percent of 1,1,1,2,3,3-hexafluoro-3-methoxy-propane, 39.5 to about 43.7 weight percent of trans-1,2-dichloroethylene and 5.2 to 5.8 weight percent of methanol, when fractionally distilled, forms a distillate fraction that is an azeotrope that boils about 37.9° C. at 734 torr;

(ii) a blend consisting essentially of 48.4 to about 53.4 weight percent of 1,1,1,2,3,3-hexafluoro-3-methoxy-propane, 44.2 to about 48.8 weight percent of trans-1,2-dichloroethylene and 2.5 to 2.7 weight percent of ethanol, when fractionally distilled, forms a distillate fraction that is an azeotrope that boils about 40.7° C. at 733 torr; or (iii) a blend consisting essentially of 48.0 to about 53.0 weight percent of 1,1,1,2,3,3-hexafluoro-3-methoxy-propane, 45.8 to about 50.6 weight percent of trans-1,2-dichloroethylene and 1.2 to 1.4 weight percent of isopropanol, when fractionally distilled, forms a distillate fraction that is an azeotrope that boils about 41.5° C. at 731 torr; or (iv) a blend consisting essentially of 42.4 to about 46.8 weight percent of 1,1,1,2,3,3-hexafluoro-3-methoxy-propane, 42.5 to about 46.9 weight percent of trans-1,2-dichloroethylene and 10.2 to 11.2 weight percent of trifluoroethanol, when fractionally distilled, forms a distillate fraction that is an azeotrope that boils about 40.6° C. at 735 torr; or (v) a blend consisting essentially of 42.0 to about 46.4 weight percent of 1,1,1,2,3,3-hexafluoro-3-methoxy-propane, 50.5 to about 55.8 weight percent of trans-1,2-dichloroethylene and 2.6 to 2.8 weight percent of pentafluoropropanol, when fractionally distilled, forms a distillate fraction that is an azeotrope that boils about 42.1° C. at 734 torr.

As is known in the art, the composition of the azeotrope will vary with pressure, e.g., as the ambient pressure increases, the boiling point of a liquid increases, and similarly, as the ambient pressure decreases, the boiling point of a liquid decreases. In some embodiments, the azeotrope-like compositions are homogeneous; i.e., they form a single phase under ambient conditions (i.e., at room temperature and atmospheric pressure).

The azeotrope-like compositions can be prepared by mixing the desired amounts of 1,1,1,2,3,3-hexafluoro-3-methoxy-propane, trans-1,2-dichloroethylene, and the third component, and any other minor components (e.g., surfactants or lubricious additives) together using conventional mixing means.

In some embodiments, the azeotrope-like compositions may be used in cleaning processes, in heat-transfer processes, as a refrigerant, as a lubricating fluid, as a coating liquid, and the like.

Various different solvent cleaning and/or decontamination techniques are known in the art. In one embodiment, a cleaning process can be carried out by contacting a contaminated substrate with one of the azeotrope-like compositions of this disclosure until the contaminants on the substrate are substantially dissolved, dispersed, or displaced in or by the azeotrope-like composition, and then removing (for example, by rinsing the substrate with fresh, uncontaminated azeotrope-like composition or by removing a substrate immersed in an azeotrope-like composition from a bath and permitting the contaminated azeotrope-like composition to flow off of the substrate) the azeotrope-like composition containing the dissolved, dispersed, or displaced contaminant from the substrate. The azeotrope-like composition can be used in either the vapor or the liquid state (or both), and any of the known techniques for "contacting" a substrate can be used. For example, the liquid azeotrope-like composition can be sprayed or brushed onto the substrate, the vaporous azeotrope-like composition can be blown across the substrate, or the substrate can be immersed in either a vaporous or a liquid azeotrope-like composition. In some embodiments, elevated temperatures, ultrasonic energy, and/or agitation can be used to facilitate the cleaning.

In some embodiments, the azeotrope-like compositions are also useful for removing contamination during semiconductor fabrication. For example, an integrated circuit or other small component may be exposed to the azeotrope-like composition to remove material not wanted on a surface, including photoresist residue, post-ion implant residue, post-etch residue, particulates, and even water.

In some embodiments, exemplary processes of this disclosure can be used to clean organic and/or inorganic substrates. Representative examples of substrates include: metals; ceramics; glass; silicon wafers; polymers for example polycarbonate, polystyrene, and acrylonitrile-butadiene-styrene copolymer; natural fibers (and fabrics derived there from) for example, cotton, silk, linen, wool, ramie, fur, leather, and suede; synthetic fibers (and fabrics derived therefrom) for example, polyester, rayon, acrylics, nylon, polyolefin, acetates, triacetates, and blends thereof, fabrics comprising natural and synthetic fibers; and combinations (e.g., laminates, mixtures, blends, etc.) of the foregoing materials. In some embodiments, the process is especially useful in the precision cleaning of electronic components (e.g., circuit boards); optical or magnetic media; and medical devices and medical articles for example syringes, surgical equipment, implantable devices, and prosthesis.

In some embodiments, exemplary cleaning and/or decontamination processes can be used to dissolve or remove most contaminants from the surface of a substrate. For example, materials such as light hydrocarbon contaminants; higher molecular weight hydrocarbon contaminants such as mineral oils, greases, cutting and stamping oils and waxes; fluorocarbon contaminants such as perfluoropolyethers, bromotrifluoroethylene oligomers (gyroscope fluids), and chlorotrifluoroethylene oligomers (hydraulic fluids, lubricants); silicone oils and greases; photoresist, solder fluxes; particulates; and other contaminants encountered in precision, electronic, metal, and medical device cleaning can be removed. In some embodiments, the process is particularly useful for the removal of hydrocarbon contaminants (especially, light hydrocarbon oils), fluorocarbon contaminants, photoresist and particulates.

In some embodiments, the azeotrope-like compositions are also useful for extraction. Here, cleaning involves removing contaminants (e.g., fats, waxes, oils, or other solvents) by dissolution or displacement of these materials from substances (e.g., naturally occurring materials, foods, cosmetics, and pharmaceuticals).

In some embodiments, exemplary azeotrope-like compositions can also be used in coating deposition applications, where the azeotrope-like composition functions as a carrier for a coating material to enable deposition of the material on the surface of a substrate, thus providing a coating composition comprising the azeotrope-like composition and a process for depositing a coating on a substrate surface using the azeotrope-like composition. The process comprises the step of applying to at least a portion of at least one surface of a substrate a coating of a liquid coating composition comprising (a) an azeotrope-like composition; and (b) at least one coating material that is soluble or dispersible in the azeotrope-like composition. The coating composition can further comprise one or more additives (e.g., surfactants, coloring agents, stabilizers, anti-oxidants, flame retardants, and the like). Preferably, the process further comprises the step of removing the azeotrope-like composition from the deposited coating by, e.g., allowing evaporation (which can be aided by the application of, e.g., heat or vacuum).

The coating materials that can be deposited by the process include: pigments, silicone lubricious additives, stabilizers, adhesives, anti-oxidants, dyes, polymers, pharmaceuticals, cosmetics, release agents, inorganic oxides, and the like, and combinations thereof. Preferred materials include: perfluoropolyethers, hydrocarbons, and silicone lubricious additives; amorphous copolymers of tetrafluoroethylene; polytetrafluoroethylene; and combinations thereof. Representative examples of materials suitable for use in the process include: titanium dioxide, iron oxides, magnesium oxide, perfluoropolyethers, polysiloxanes, stearic acid, acrylic adhesives, polytetrafluoroethylene, amorphous copolymers of tetrafluoroethylene, and combinations thereof. Any of the substrates described above (for decontamination applications) can be coated. Particularly useful in one embodiment, is coating magnetic hard disks or electrical connectors with perfluoropolyether lubricants or medical devices with silicone lubricious additives.

To form a coating composition, the components of the composition (i.e., the azeotrope-like composition, the coating material(s), and any additive(s) used) can be combined by any conventional mixing technique used for dissolving, dispersing, or emulsifying coating materials, e.g., by mechanical agitation, ultrasonic agitation, manual agitation, and the like. The azeotrope-like composition and the coating material(s) can be combined in any ratio depending upon the desired thickness of the coating. In some embodiments, the coating material(s) comprise from about 0.1 to about 10 weight percent of the coating composition.

Exemplary deposition processes of this disclosure can be carried out by applying the coating composition to a substrate by any conventional technique. For example, the composition can be brushed or sprayed (e.g., as an aerosol) onto the substrate, or the substrate can be spin-coated. In some embodiments, the substrate is coated by immersion in the composition. Immersion can be carried out at any suitable temperature and can be maintained for any convenient length of time. If the substrate is a tube, such as a catheter and it is desired to ensure that the composition coats the lumen wall of the catheter, it may be advantageous to draw the composition into the lumen by the application of reduced pressure.

In some embodiments, after a coating is applied to a substrate, the azeotrope-like composition can be removed from the deposited coating by evaporation. In some embodiments, the rate of evaporation can be accelerated by application of reduced pressure or mild heat. The coating can be of any desired thickness. Generally, the thickness will be determined by, for example, such factors as the viscosity of the coating material, the temperature at which the coating is applied, and the rate of withdrawal (if immersion is used).

In some embodiments, the azeotrope-like compositions of the present invention can be used as heat-transfer fluids in heat-transfer processes where the heat-transfer fluids can transfer thermal energy (e.g., heat) either in a direct or indirect manner. Direct heat transfer (sometimes called "direct contact heat transfer") refers to a heat-transfer process wherein a heat-transfer fluid conducts heat directly to and/or from a heat sink or source to a fluid by directly contacting the fluid with the heat sink or source. Examples of direct heat transfer include the immersion cooling of electrical components and the cooling of an internal combustion engine.

Indirect heat transfer refers to a heat-transfer process wherein a heat-transfer fluid conducts heat to and/or from a heat sink or source without directly contacting the fluid with the heat sink or source. Examples of indirect heat transfer include: refrigeration, air conditioning and/or heating (e.g., using heat pumps) processes, such as are used in buildings, vehicles, and stationary machinery. In other embodiments, a process for transferring heat is provided comprising employing an azeotrope-like composition as a secondary loop refrigerant or as a primary loop refrigerant. In these embodiments, the secondary loop refrigerant (i.e., a wide temperature range liquid fluid) provides a means for transferring heat between the heat source and the primary loop refrigerant (i.e., a low temperature-boiling fluid, which accepts heat by e.g., expanding to a gas and rejects heat by being condensed to a liquid, typically by using a compressor). Examples of equipment in which the azeotrope-like composition may be useful include: centrifugal chillers, household refrigerator/freezers, automotive air conditioners, refrigerated transport vehicles, heat pumps, supermarket food coolers and display cases, and cold storage warehouses.

In indirect heat-transfer processes, lubricious additives for heat transfer can be incorporated in the heat-transfer fluid where moving parts (e.g., pumps and valves) are involved to ensure that the moving parts continue to work over long periods of time. Generally, these lubricious additives should possess good thermal and hydrolytic stability and should exhibit at least partial solubility in the heat-transfer fluid. Examples of suitable lubricious additives include: mineral oils, fatty esters, highly halogenated oils such as chlorotrifluoroethylene-containing polymers, and synthetic lubricious additives such as alkylene oxide polymers. The azeotrope-like compositions can also function as a working fluid in an organic Rankine cycle, for example to recover energy from sources such as waste heat from industrial processes, geothermal heat, or solar heat.

In some embodiments, the azeotrope-like compositions can be used to formulate working fluids or lubricants that comprise the azeotrope-like compositions of the present invention and at least one fully volatile lubricious additive. A lubricious additive is defined herein as an additive that modifies the coefficient of friction between a work piece and tooling. In some embodiments, an azeotrope-like composition with the lubricious additive form the working fluid for a working operation.

Exemplary substrates in working operations include: metal, cermet, and composite work pieces. Exemplary metals include: refractory metals (e.g., tantalum, niobium, molybdenum, vanadium, tungsten, hafnium, rhenium, and titanium); precious metals (e.g., silver, gold, and platinum); high temperature metals (e.g., nickel, titanium alloys, and nickel chromes); other metals including, for example, magnesium, copper, aluminum, steel (e.g., stainless steels); alloys (e.g., brass, and bronze); and any combinations thereof.

Typically, working fluids lubricate machining surfaces, resulting in a smooth and substantially residue-free machined work piece surface. In some embodiments, exemplary working fluids used in these operations also cool the machining environment (e.g., the surface interface between a work piece and a machining tool) by, for example, removing heat and/or particulate matter therefrom.

Cermets are semi synthetic-products consisting of a mixture of ceramic and metallic components having physical properties not found solely in either one alone. Examples include: metal carbides, oxides, and silicides.

Composites are described herein as combinations (e.g., laminate, mixture, blend, etc.) of high temperature fibers in a polymer matrix, for example, a glass or carbon fiber in an epoxy resin.

In some embodiments, a working fluid is formulated so that the cutting and forming processes are lubricated to reduce friction, heat build-up in the tool or work piece, and/or prevent material transfer from the work piece to the tool. In some embodiments, a working fluid fully wets the working tooling. In some embodiments, the azeotrope-like composition included in the working liquid evaporates from the working tool and work piece. In some embodiments, the lubricious additive is present as a thin film that reduces friction and heat build-up on the surfaces of the tool and work piece, and/or prevents material transfer from the work piece to the tooling. Generally, the lubricious additive is selected such that it is sufficiently high in boiling point to lubricate the working process without evaporating prematurely and still low enough in boiling point to fully evaporate from the working process so that little or no residue remains (i.e., is volatile). Examples of lubricious additives for working operations include: esters of $C_8$ to $C_{14}$ fatty acids, alkylene glycol ethers, hydrocarbon distillates, and esters of lactic acid.

In each of the described uses, the azeotrope-like composition can be used as such, or a blend of azeotrope-like compositions may be used, provided the blend also is azeotrope-like. Similarly, minor amounts of co-solvents can be added to the azeotrope-like compositions, provided the addition does not disrupt the azeotropic behavior. Useful co-solvents may include, for example, hydrofluorocarbons (HFCs), hydrocarbons, hydrochlorocarbons (HCCs), or water. Representative examples of suitable co-solvents include: carbon dioxide; 1,1-difluoroethane; 1-hydropentadecafluoroheptane; 1,1,1,2-tetrafluoroethane; 1,1,1,3,3-pentafluoropropane; 2-chloropropane; water; saturated perfluorochemicals (e.g., perfluoropentane, perfluorohexane, and perfluoro(N-methylmorpholine)); and combinations thereof. In some embodiments, the azeotrope-like composition may further comprise hydrofluoric acid (HF).

Advantages and embodiments of this disclosure are further illustrated by the following examples, but the particular materials and amounts thereof recited in these examples, as well as other conditions and details, should not be construed to unduly limit this invention. All materials are commercially available or known to those skilled in the art unless otherwise stated or apparent.

EXAMPLES

The preparation, identification, and testing of the azeotrope-like compositions of this disclosure are further described in the following examples. The particular materials and amounts thereof recited in these examples, as well as other conditions and details, should not be construed to unduly limit this invention. In these examples, all percentages, proportions and ratios are by weight unless otherwise indicated.

The 1,1,1,2,3,3-hexafluoro-3-methoxy-propane may be obtained from Synquest Labs, Inc, Alachua, Fla., trans-1,2-dichloroethylene, and the third component were obtained from Aldrich Chemical Company, Inc. (Milwaukee, Wis.).

Examples 1-3

Various mixtures of 1,1,1,2,3,3-hexafluoro-3-methoxy-propane, trans-1,2-dichloroethylene, and the third component were distilled at ambient pressure (average 731 to 734 torr) using the following procedure to identify whether the mixture formed ternary azeotropes, and if so, the composition and boiling point (bp ° C.) of the azeotrope was recorded. At least two distillations were conducted and the results averaged. The mixtures were prepared and distilled at ambient lab pressure (731 to 735 torr) in a concentric tube distillation column (Model 933 from Ace Glass, Vinland, N.J.). In each case, the distillation was allowed to equilibrate at total reflux for at least 60 minutes. For each distillation, five successive distillate samples, each approximately 10 percent by volume of the total liquid charge, were taken while operating the column at a liquid reflux ratio of 10 to 1. The compositions of the distillate samples were then analyzed using an HP-5890 Series II Plus Gas Chromatograph with an RTX-200 capillary column (Restek Corp., Bellefonte, Pa.) or Nukol capillary column (Supelco, Bellefonte, Pa.) or a Quadrex 007 Series Methyl Silicone capillary column (Quadrex Corp., New Haven, Conn.) and a thermal conductivity detector. The boiling point of each distillate was measured using a thermocouple. Following this test procedure, azeotropes of 1,1,1,2,3,3-hexafluoro-3-methoxy-propane, trans-1,2-dichloroethylene and a third component were identified.

In Table 1 shown below, the compositions and boiling points (at the indicated pressure) of the five azeotropes are presented as Examples 1-5.

TABLE 1

| Example | | Composition | bp (° C.) | Pressure torr (kPa) |
|---|---|---|---|---|
| 1 | 52.9% | 1,1,1,2,3,3-hexafluoro-3-methoxy-propane | 37.9 | 734 (97.9) |
|   | 41.6% | trans-1,2-dichloroethylene | | |
|   | 5.5%  | methanol | | |
| 2 | 50.9% | 1,1,1,2,3,3-hexafluoro-3-methoxy-propane | 40.7 | 733 (97.7) |
|   | 46.5% | trans-1,2-dichloroethylene | | |
|   | 2.6%  | ethanol | | |
| 3 | 50.5% | 1,1,1,2,3,3-hexafluoro-3-methoxy-propane | 41.5 | 731 (97.5) |
|   | 48.2% | trans-1,2-dichloroethylene | | |
|   | 1.3%  | isopropanol | | |
| 4 | 44.6% | 1,1,1,2,3,3-hexafluoro-3-methoxy-propane | 40.6 | 735 (98.0) |
|   | 44.7% | trans-1,2-dichloroethylene | | |
|   | 10.7% | trifluoroethanol | | |
| 5 | 44.2% | 1,1,1,2,3,3-hexafluoro-3-methoxy-propane | 42.1 | 734 (97.9) |
|   | 53.1% | trans-1,2-dichloroethylene | | |
|   | 2.7%  | pentafluoropropanol | | |

Foreseeable modifications and alterations of this disclosure will be apparent to those skilled in the art without departing from the scope and spirit of this disclosure. This invention should not be restricted to the embodiments that are set forth in this application for illustrative purposes.

What is claimed is:

1. An azeotrope-like composition comprising a blend of 1,1,1,2,3,3-hexafluoro-3-methoxy-propane, trans-1,2-dichloroethylene, and a third component, wherein the composition is selected from:

(i) a blend consisting essentially of 1,1,1,2,3,3-hexafluoro-3-methoxy-propane, trans-1,2-dichloroethylene and methanol, when fractionally distilled, forms a distillate fraction that is an azeotrope consisting essentially of about 52.9 weight percent of 1,1,1,2,3,3-hexafluoro-3-methoxy-propane, 41.6 weight percent of trans-1,2-dichloroethylene and 5.5 weight percent of methanol that boils about 37.9° C. at 734 torr; or (ii) a blend consisting essentially of 1,1,1,2,3,3-hexafluoro-3-methoxy-propane, trans-1,2-dichloroethylene and ethanol, when fractionally distilled, forms a distillate fraction that is an azeotrope consisting essentially of about 50.9 weight percent of 1,1,1,2,3,3-hexafluoro-3-methoxy-propane, 46.5 weight percent of trans-1,2-dichloroethylene and 2.6 weight percent of ethanol that boils about 40.7° C. at 733 torr; or (iii) a blend consisting essentially of 1,1,1,2,3,3-hexafluoro-3-methoxy-propane, trans-1,2-dichloroethylene and isopropanol when fractionally distilled, forms a distillate fraction that is an azeotrope consisting essentially of about 50.5 weight percent of 1,1,1,2,3,3-hexafluoro-3-methoxy-propane, 48.2 weight percent of trans-1,2-dichloroethylene and 1.3 weight percent of isopropanol that boils about 41.5° C. at 731 torr; or (iv) a blend consisting essentially of 1,1,1,2,3,3-hexafluoro-3-methoxy-propane, trans-1,2-dichloroethylene and trifluoroethanol when fractionally distilled, forms a distillate fraction that is an azeotrope consisting essentially of about 44.6 weight percent of 1,1,1,2,3,3-hexafluoro-3-methoxy-propane, 44.7 weight percent of trans-1,2-dichloroethylene and 10.7 weight percent of trifluoroethanol that boils about 40.6° C. at 735 torr; or (v) a blend consisting essentially of 1,1,1,2,3,3-hexafluoro-3-methoxy-propane, trans-1,2-dichloroethylene and pentafluoropropanol when fractionally distilled, forms a distillate fraction that is an azeotrope consisting essentially of 44.2 weight percent of 1,1,1,2,3,3-hexafluoro-3-methoxy-propane, 53.1 weight percent of trans-1,2-dichloroethylene and 2.7 weight percent of pentafluoropropanol that boils about 42.1° C. at 734 torr.

2. The azeotrope-like composition according to claim 1 wherein the concentrations of 1,1,1,2,3,3-hexafluoro-3-methoxy-propane, trans-1,2-dichloroethylene, and the third component in the azeotrope-like composition differ from the concentrations of such components in the corresponding azeotrope by no more than about ten percent.

3. An azeotrope-like composition according to claim 1 wherein the concentrations of the 1,1,1,2,3,3-hexafluoro-3-methoxy-propane, trans-1,2-dichloroethylene, and the third component in the azeotrope-like composition differ from the concentrations of such components in the corresponding azeotrope by no more than about five percent.

4. An azeotrope-like composition according to claim 1 wherein the azeotrope-like composition is an azeotrope.

5. The azeotrope-like compositions of claim 1 comprising a blend of 1,1,1,2,3,3-hexafluoro-3-methoxy-propane, trans-1,2-dichloroethylene and a third component, wherein the blend is selected from:

(i) a blend consisting essentially of 47.6 to about 58.2 weight percent of 1,1,1,2,3,3-hexafluoro-3-methoxy-propane, 37.4 to about 45.8 weight percent of trans-1,2-dichloroethylene and 5.0 to 6.0 weight percent of methanol; or (ii) a blend consisting essentially of 45.8 to about 56.0 weight percent of 1,1,1,2,3,3-hexafluoro-3-methoxy-propane, 41.9 to about 51.2 weight percent of trans-1,2-dichloroethylene and 2.3 to 2.9 weight percent of ethanol; or (iii) a blend consisting essentially of 45.5 to about 55.6 weight percent of 1,1,1,2,3,3-hexafluoro-3-methoxy-propane, 43.4 to about 53.0 weight percent of trans-1,2-dichloroethylene and 1.2 to 1.4 weight percent of isopropanol; or (iv) a blend consisting essentially of 40.1 to about 49.1 weight percent of 1,1,1,2,3,3-hexafluoro-3-methoxy-propane, 40.2 to about 49.2 weight percent of trans-1,2-dichloroethylene and 9.6 to 11.8 weight percent of trifluoroethanol; or (v) a blend consisting essentially of 39.8 to about 48.6 weight percent of 1,1,1,2,3,3-hexafluoro-3-methoxy-propane, 47.8 to about 58.4 weight percent of trans-1,2-dichloroethylene and 2.4 to 3.0 weight percent of pentafluoropropanol.

6. The azeotrope-like composition of claim 1 comprising a blend of 1,1,1,2,3,3-hexafluoro-3-methoxy-propane, trans-1,2-dichloroethylene and a third component, wherein the blend is selected from:

(i) a blend consisting essentially of 50.3 to about 55.5 weight percent of 1,1,1,2,3,3-hexafluoro-3-methoxy-propane, 39.5 to about 43.7 weight percent of trans-1,2-dichloroethylene and 5.2 to 5.8 weight percent of methanol; or (ii) a blend consisting essentially of 48.4 to about 53.4 weight percent of 1,1,1,2,3,3-hexafluoro-3-methoxy-propane, 44.2 to about 48.8 weight percent of trans-1,2-dichloroethylene and 2.5 to 2.7 weight percent of ethanol; or (iii) a blend consisting essentially of 48.0 to about 53.0 weight percent of 1,1,1,2,3,3-hexafluoro-3-methoxy-propane, 45.8 to about 50.6 weight percent of trans-1,2-dichloroethylene and 1.2 to 1.4 weight percent of isopropanol; or (iv) a blend consisting essentially of 42.4 to about 46.8 weight percent of 1,1,1,2,3,3-hexafluoro-3-methoxy-propane, 42.5 to about 46.9 weight percent of trans-1,2-dichloroethylene and 10.2 to 11.2 weight percent of trifluoroethanol; or (v) a blend consisting essentially of 42.0 to about 46.4 weight percent of 1,1,1,2,3,3-hexafluoro-3-methoxy-propane, 50.5 to about 55.8 weight percent of trans-1,2-dichloroethylene and 2.6 to 2.8 weight percent of pentafluoropropanol.

7. A ternary azeotrope comprising a blend of 1,1,1,2,3,3-hexafluoro-3-methoxy-propane, trans-1,2-dichloroethylene, and a third component wherein the blend is selected from:

(i) a blend consisting essentially of 52.9 weight percent of 1,1,1,2,3,3-hexafluoro-3-methoxy-propane, 41.6 weight percent of trans-1,2-dichloroethylene and 5.5 weight percent of methanol that boils about 37.9° C. at 734 torr; or (ii) a blend consisting essentially of 50.9 weight percent of 1,1,1,2,3,3-hexafluoro-3-methoxy-propane, 46.5 weight percent of trans-1,2-dichloroethylene and 2.6 weight percent of ethanol that boils about 40.7° C. at 733 torr; or (iii) a blend consisting essentially of 50.5 weight percent of 1,1,1,2,3,3-hexafluoro-3-methoxy-propane, 48.2 weight percent of trans-1,2-dichloroethylene and 1.3 weight percent of isopropanol that boils about 41.5° C. at 731 torr; or (iv) a blend consisting essentially of 44.6 weight percent of 1,1,1,2,3,3-hexafluoro-3-methoxy-propane, 44.7 weight percent of trans-1,2-dichloroethylene and 10.7 weight percent of trifluoroethanol that boils about 40.6° C. at 735 torr; or (v) a blend consisting essentially of 44.2 weight percent of 1,1,1,2,3,3-hexafluoro-3-methoxy-propane, 53.1 weight percent of trans-1,2-dichloroethylene and 2.7 weight percent of pentafluoropropanol that boils about 42.1° C. at 734 torr.

8. A coating composition comprising an azeotrope-like composition according to claim 1 and at least one coating material.

9. A coated article comprising a substrate having a first surface, wherein the coating composition of claim 8 contacts at least a portion of the first surface.

10. A process for depositing a coating on a substrate surface comprising applying the coating composition of claim 8 to at least a portion of at least one surface of the substrate, wherein the at least one coating material is soluble or dispersible in the azeotrope-like composition.

11. A working fluid comprising the azeotrope-like composition according to claim 1 and a lubricious additive.

12. The working fluid according to claim 11, wherein said lubricious additive is volatile.

13. The azeotrope-like composition of claim 1, further comprising hydrofluoric acid.

14. A process for lubricating metal, cermet, or composite, wherein said process is lubricated using the working fluid of claim 11.

15. A process for removing contaminants from the surface of a substrate comprising the steps of contacting the substrate with one or more of the azeotrope-like compositions according to claim 1 until the contaminants are dissolved, dispersed, or displaced in or by the azeotrope-like composition, and removing the azeotrope-like composition containing the dissolved, dispersed or displaced contaminants from the surface of the substrate.

16. A process for heat transfer wherein at least one of the azeotrope-like compositions according to claim 1 is used as a heat-transfer fluid.

\* \* \* \* \*